United States Patent
DiVergilio (10) Patent No.: US 7,947,966 B2
(45) Date of Patent: May 24, 2011

(54) DOUBLE PLASMA ION SOURCE

(75) Inventor: William F. DiVergilio, Brookline, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 373 days.

(21) Appl. No.: 12/183,961

(22) Filed: Jul. 31, 2008

(65) Prior Publication Data

US 2009/0114841 A1 May 7, 2009

Related U.S. Application Data

(60) Provisional application No. 60/952,895, filed on Jul. 31, 2007, provisional application No. 60/952,916, filed on Jul. 31, 2007, provisional application No. 60/981,576, filed on Oct. 22, 2007.

(51) Int. Cl.
*H01J 27/02* (2006.01)
(52) U.S. Cl. .................................. 250/427; 250/423 R
(58) Field of Classification Search .................. 250/427, 250/423 F, 423 R, 424, 492.21
See application file for complete search history.

(56) References Cited

U.S. PATENT DOCUMENTS

| | | | | |
|---|---|---|---|---|
| 5,083,061 A | * | 1/1992 | Koshiishi et al. | 315/111.81 |
| 5,296,713 A | * | 3/1994 | Tanaka | 250/423 R |
| 5,306,921 A | * | 4/1994 | Tanaka et al. | 250/492.21 |
| 5,497,006 A | | 3/1996 | Sferlazzo et al. | |
| 5,661,308 A | | 8/1997 | Benveniste et al. | |
| 6,686,595 B2 | | 2/2004 | Horsky | |
| 7,022,999 B2 | | 4/2006 | Horsky et al. | |
| 7,498,592 B2 | * | 3/2009 | Hershkowitz et al. | 250/492.3 |
| 2006/0169915 A1 | | 8/2006 | Olson et al. | |

* cited by examiner

*Primary Examiner* — Kiet T Nguyen
(74) *Attorney, Agent, or Firm* — Eschweiler & Associates, LLC (57) ABSTRACT

An ion source includes a first plasma chamber including a plasma generating component and a first gas inlet for receiving a first gas such that said plasma generating component and said first gas interact to generate a first plasma within said first plasma chamber, wherein said first plasma chamber further defines an aperture for extracting electrons from said first plasma, and a second plasma chamber including a second gas inlet for receiving a second gas, wherein said second plasma chamber further defines an aperture in substantial alignment with the aperture of said first plasma chamber, for receiving electrons extracted therefrom, such that the electrons and the second gas interact to generate a second plasma within said second plasma chamber, said second plasma chamber further defining an extraction aperture for extracting ions from said second plasma.

16 Claims, 4 Drawing Sheets

DOUBLE PLASMA ION SOURCE

REFERENCE TO RELATED APPLICATION

This application claims priority to and the benefit of U.S. Provisional Application Ser. No. 60/952,895 which was filed Jul. 31, 2007, entitled ELEVATED TEMPERATURE RF ION SOURCE, U.S. Provisional Application Ser. No. 60/952,916 which was filed Jul. 31, 2007, entitled HYBRID ION SOURCE/MULTIMODE ION SOURCE, and U.S. Provisional Application Ser. No. 60/981,576 which was filed on Oct. 22, 2007, the entirety of each being hereby incorporated by reference as if fully set forth herein.

FIELD OF THE INVENTION

The present invention relates generally to ion implantation systems, and more specifically to a system and method for utilizing a double plasma ion source for ion implantation.

BACKGROUND OF THE INVENTION

In the manufacture of semiconductor devices and further products, ion implantation systems are used to impart dopant elements into semiconductor workpieces, display panels, glass substrates, and the like. Typical ion implantation systems or ion implanters implant a workpiece with an ion beam of impurities in order to produce n-type and/or p-type doped regions, or to form passivation layers in the workpiece. When used for doping semiconductors, the ion implantation system injects a selected ion species into the workpiece to produce the desired extrinsic material properties. Typically, dopant atoms or molecules are ionized and isolated, accelerated and/or decelerated, formed into a beam, and implanted into a workpiece. The dopant ions physically bombard and enter the surface of the workpiece, and typically come to rest below the workpiece surface in the crystalline lattice structure thereof.

A typical ion implantation system is generally a collection of sophisticated subsystems, wherein each subsystem performs a specific action on the dopant ions. Dopant elements can be introduced in gas form (e.g., a process gas) or in a solid form that is subsequently vaporized, wherein the dopant elements are positioned inside an ionization chamber and ionized by a suitable ionization process. Over the last decade the so-called "Bernas-style" ion source has become generally accepted as an industry standard for both high and medium current ion implantation systems. For example, the ionization chamber is maintained at a low pressure (e.g., a vacuum), wherein a filament, for example is located within the ionization chamber and heated to a point where electrons are emitted from the filament. Negatively-charged electrons from the filament are then attracted to an oppositely-charged anode within the chamber, wherein during the travel from the filament to the anode, the electrons collide with the dopant source elements (e.g., molecules or atoms), which results in the separation of electrons from the source gas material, thereby ionizing the source gas and creating a plasma, i.e., a plurality of positively charged ions and negatively charged electrons from the dopant source elements. The positively charged ions are subsequently "extracted" from the chamber through an extraction slit or aperture via an extraction electrode, wherein the ions are generally directed along an ion beam path toward the workpiece.

Heated filament cathodes of the type described above typically degrade rapidly over time. As a result, a common variation to this style of ion source has been developed and deployed in commercial ion implantation systems, which employs an Indirectly Heated Cathode (IHC), wherein the electron emitter is a cylindrical cathode, typically 10 mm in diameter and 5 mm thick, positioned within the ionization chamber. This cathode is heated by an electron beam extracted from a filament located behind the cathode, thereby protected from the harsh environment of the ionization chamber. An exemplary IHC ion source is shown, for example, in commonly assigned U.S. Pat. No. 5,497,006, among other patents.

In the case of a filament cathode, the cathode heater power is typically on the order of a few hundred watts, and in the case of an IHC, typically on the order of one kilowatt. When operating with standard implantation gases such as boron trifluoride ($BF_3$), phosphine ($PH_3$) and arsine ($AsH_3$), typical maximum extracted ion beam currents are in the range of 50 to 100 mA, requiring a discharge power (cathode voltage times cathode current) of hundreds of watts. With these cathode heater powers and discharge powers, the walls of the ion source typically reach temperatures in excess of 400 degrees C. For operation with standard gases, these high wall temperatures are advantageous as condensation of phosphorus and arsenic on the walls is prevented, greatly reducing cross contamination when changing dopant species.

Substantial improvements in throughput have been demonstrated for low energy boron implants, for example using large molecules such as decaborane ($B_{10}H_{14}$) and octadecaborane ($B_{18}H_{22}$). Discharge powers and plasma densities in such large molecule plasmas must be maintained at much lower levels than for standard implant gases in order to prevent dissociation of the molecules. Typically, extracted ion currents are 5 to 10 mA requiring only tens of watts of discharge power. Though the standard sources described above can run stably at these low powers with standard implant gases, problems are encountered when running decaborane or octadecaborane. In the case of the Bernas source, where the filament is in contact with the gas, the filament is attacked by the borane and a stable discharge cannot be maintained. In the case of the IHC, the discharge is much more stable, but thermal dissociation of the large molecules is unacceptably high. Dissociation occurs both on the hot cathode and on the walls, which are difficult to maintain at low temperature due to the high radiative power of the cathode.

The problems described above, encountered when operating with gases such as decaborane and octadecaborane, can be overcome by removing the electron source from the ionization chamber. One such solution is described in U.S. Pat. No. 6,686,595, wherein a conventional broad beam electron gun is mounted external to the ionization chamber and the electron beam is guided through an aperture into the ionization chamber. However, in this source configuration electron current injected into the ionization chamber is limited to tens of milliamps due to fundamental limitations of electron gun design. Since operation with standard implant gases at the standard ion beam currents of 50 to 100 mA requires electron currents of hundreds of milliamps to amps, this ion source configuration is not suitable for such operation. Indeed, this problem has become well recognized by the ion implant system manufacturers, and at least one solution has been described, as for example in U.S. Pat. No. 7,022,999, wherein it has been proposed to configure the ionization chamber in two discrete modes of operation: one mode for low electron current ionization applications; and one mode for high electron current ionization applications. Alternatively, an ion source configuration has been proposed in U.S. Patent Application Publication No. US 2006/0169915, wherein first and second electron sources are located at opposite ends of and arc chamber, with each electron source being energized in one of a so-called "hot" operating mode and a "cold" operating mode.

Accordingly, a need exists for an ion source which can operate with low source wall temperature and low discharge power for large molecule gases (so-called "molecular species") and with high wall temperature and high discharge power for standard implant gases (so-called "monomer species") in order to meet more of the needs of the ion implantation industry.

SUMMARY OF THE INVENTION

The present invention is directed to providing a two plasma or double plasma ion source system and method for efficiently operating an ion source that can utilize large molecules, such as decaborane and octadecaborane as well as standard implantation gases such as $BF_3$, $PH_3$ and $AsH_3$. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later. The present invention is directed generally toward an ion source for use in an ion implantation system, wherein the ion source incorporates two or more plasma chambers, such that the first plasma chamber is operative to generate electrons for injection into the second plasma chamber so that the second plasma chamber can efficiently and effectively generate ions for injection into an ion beam line of an ion implantation system.

According to one exemplary aspect of the invention, an ion source is provided, comprising: a first plasma chamber, referred to hereinafter as the electron source plasma chamber, and includes a plasma generating component for generating a plasma from the ionization of a first source gas. The ion source also comprises a second plasma chamber, referred to hereinafter as the ion source plasma chamber, into which electrons from the electron source plasma chamber are injected, creating a plasma from a second source gas. The ion source can include a high voltage extraction system including an electrode system configured to extract ions from the ion source plasma chamber via an extraction aperture formed therein.

In another exemplary aspect of the invention, a method is provided for ion generation, the method comprising: forming an electron source plasma in a first plasma chamber; extracting electrons from the plasma formed in the first plasma generating chamber so as to direct the extracted electrons into a second plasma chamber, whereby the extracted electrons generating a plasma within the second plasma chamber. The method further comprises extracting ions through an extraction aperture located in the second plasma chamber.

In yet another aspect of the invention, an ion implantation system is provided, including an ion source for injecting ions into an ion beamline for implantation into a workpiece. The ion source includes a first plasma chamber, (the electron source plasma chamber) for generating a plasma from ionization of a first source gas; and a second plasma chamber (the ion source plasma chamber, into which electrons from the electron source plasma chamber are injected, for generating a plasma from a second source gas. The ion implantation system further includes an extraction system including an electrode configured to extract ions from the ion source plasma chamber via an extraction aperture formed therein.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed generally towards an improved ion source apparatus used in ion implantation. More particularly, the system and methods of the present invention provide an efficient way to ionize large molecule ionization gases for the production of molecular ion implantation species, such as, for example: carborane; decaborane; octadecaborane and icosaboranes, as well as standard ionization gases for the production of monomer ion implant species, such as boron trifluoride, phosphine and arsine. It will be understood that the foregoing list of ion implantation species is provided for illustrative purposes only, and shall not be considered to represent a complete list of the ionization gases that could be used to generate ion implant species. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 1:
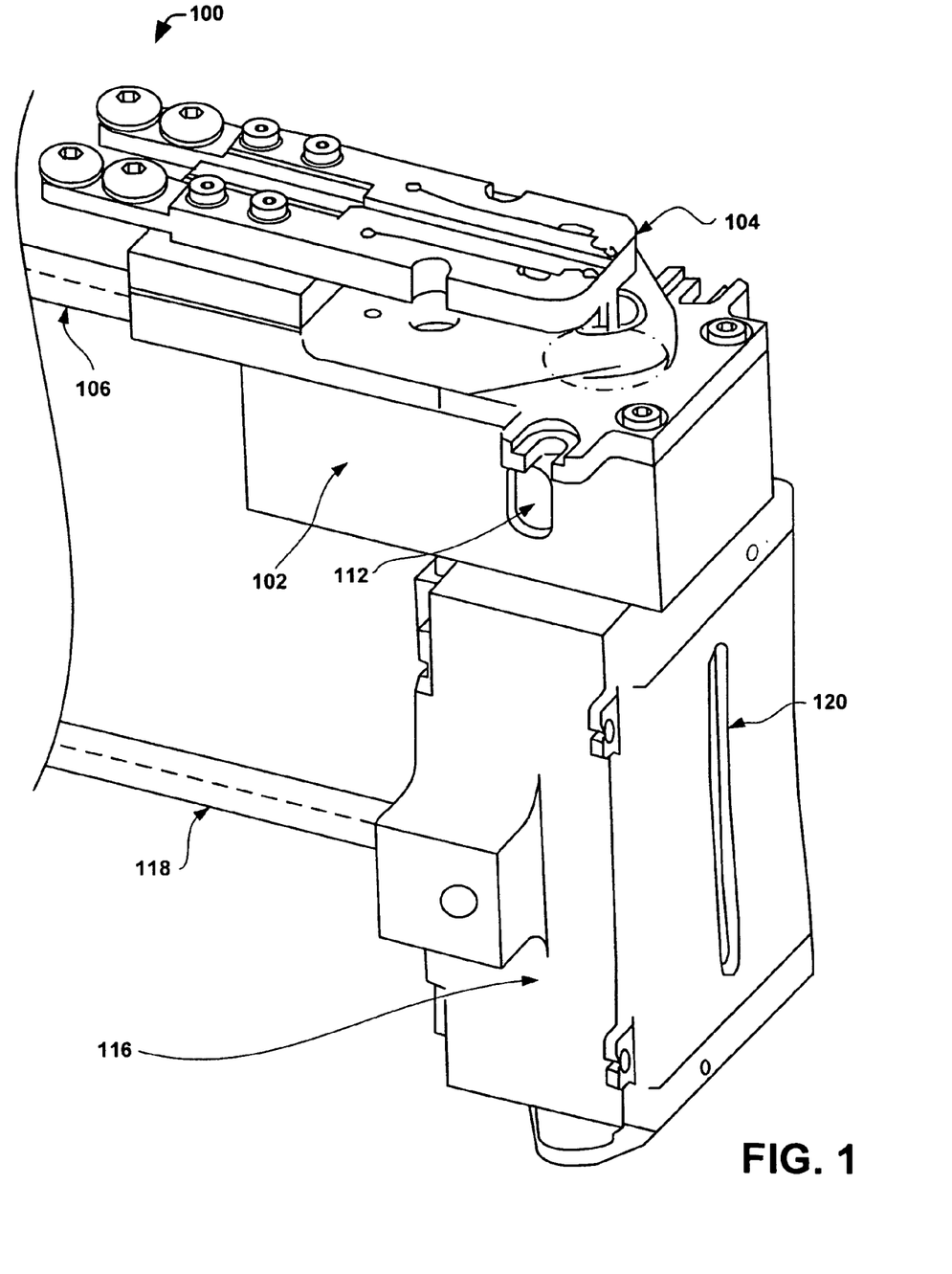
FIG. 1 illustrates an isometric perspective view of an exemplary ion source in accordance with one aspect of the present invention.
Figure 2:
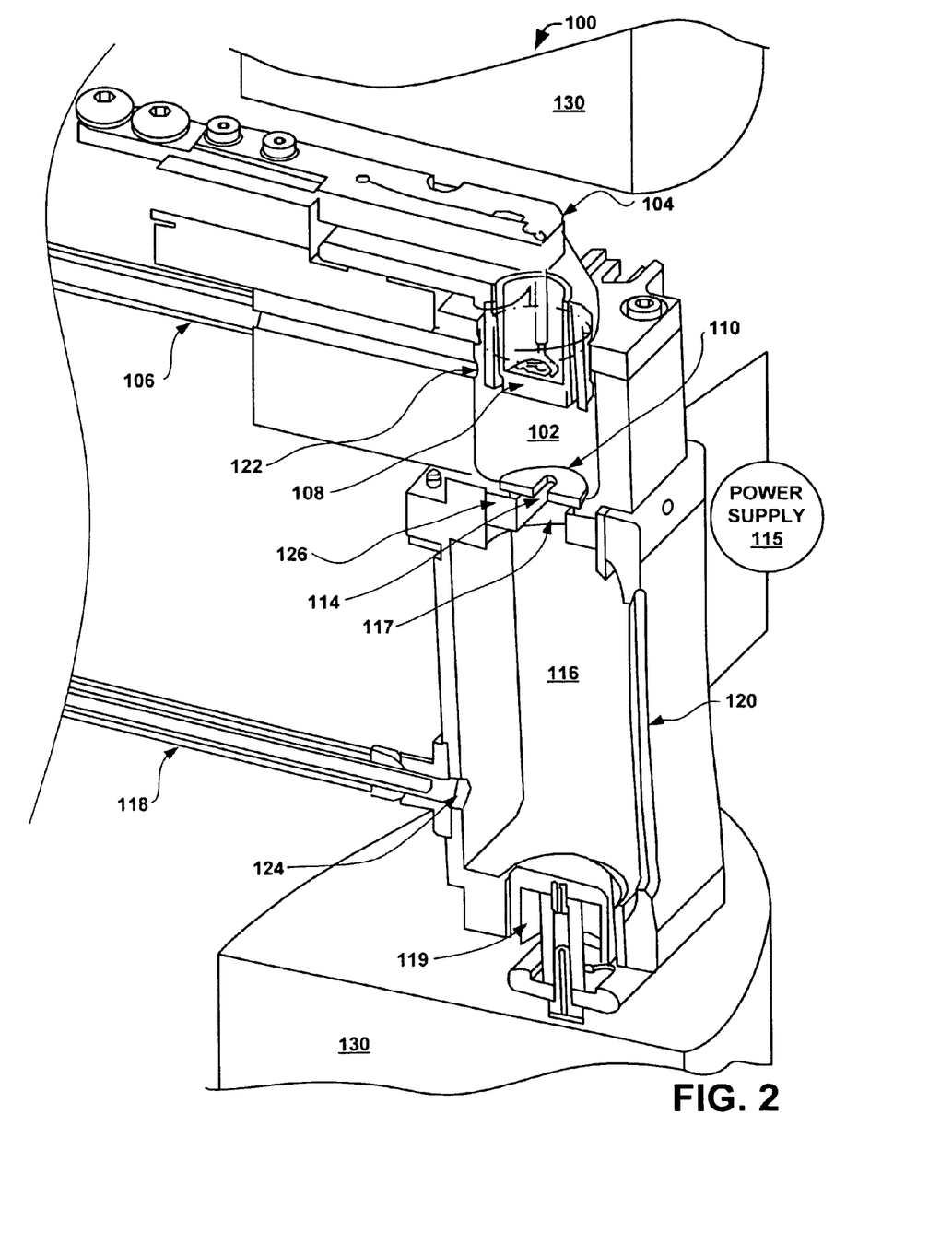
FIG. 2 illustrates a cross sectional perspective view of an exemplary ion source in accordance with one aspect of the present invention.

Referring now to the figures, FIGS. 1 and 2 illustrate a simplified exemplary ion source 100 in accordance with the present invention, wherein the ion source 100 is suitable for implementing one or more aspects of the present invention. It should be noted that the ion source 100 depicted in FIG. 1 is provided for illustrative purposes and is not intended to include all aspects, components, and features of an ion source. Instead, the exemplary ion source 100 is depicted so as to facilitate a further understanding of the present invention.

The ion source 100, for example, comprises a first plasma chamber 102 situated adjacent a second plasma chamber 116. The first plasma chamber 102 includes a gas source supply line 106 and is a configured with a plasma generating component 104 for creating a plasma from a first source gas. A source gas is introduced into the first plasma chamber 102 by the gas supply line 106. The source gas can comprise at least one of the following: inert gases such as argon (Ar) and xenon (Xe), standard ion implantation gases such as boron trifluoride ($BF_3$), arsine ($AsH_3$) and phosphine ($PH_3$), and reactive gases such as oxygen ($O_2$) and nitrogen trifluoride ($NF_3$). Once again, it will be understood that the foregoing list of source gases is provided for illustrative purposes only, and shall not be considered to represent a complete list of the source gases that could be delivered to the first plasma chamber.

The plasma generating component 104 can comprise a cathode 108/anode 110 combination, wherein the cathode 108 may include a simple Bernas-type filament configuration, or an indirectly heated cathode of the type illustrated in FIGS. 1 and 2. Alternatively, the plasma generating component 104 may include an RF induction coil antenna that is supported having a radio frequency conducting segment mounted directly within a gas confinement chamber to deliver ionizing energy into the gas ionization zone, for example, as disclosed in commonly assigned U.S. Pat. No. 5,661,308, which is hereby incorporated by reference in its entirety.

The first, or electron source, plasma chamber 102 defines an aperture 112 forming a passageway into a high vacuum region of an ion implantation system, i.e. a region wherein pressure is much lower than the pressure of the source gas in the first plasma chamber 102. The aperture 112 provides a pumping aperture for maintaining source gas purity at a high level, as will be further discussed hereinbelow.

The electron source plasma chamber 102 also defines an aperture 114 forming an extraction aperture for extracting electrons from the electron source plasma chamber 102. In a preferred embodiment, the extraction aperture 114 is provided in the form of a replaceable anode element 110 as illustrated in FIG. 2, having an aperture 114 formed therein. As such, it will be recognized by those of skill in the art that the electron source plasma chamber 102 can be configured to have a positively biased electrode 119 (relative to the cathode 108) for attracting electrons from the plasma in a so-called non-reflex mode. Alternatively, the electrode 119 can be biased negatively relative to the cathode 108 to cause electrons to be repelled back into the electron source plasma chamber 102 in a so-called reflex mode. It will be understood that this reflex mode configuration would require proper biasing of the plasma chamber walls, together with electrical insulation and independent biasing of the electrode 119.

As previously stated, the ion source 100 of the present invention also includes a second, or ion source chamber 116. The second ion source plasma chamber 116 includes a second gas source supply line 118 for introducing a source gas into the ion source plasma chamber 116 and is further configured to receive electrons from the electron source plasma chamber 102, thereby creating plasma therein via the collisions between the electrons and the second source gas. The second source gas can comprise any of the gases listed above for the electron source plasma chamber 102 or any large molecule gases such as carborane ($C_2B_{10}H_{12}$), decaborane ($B_{10}H_{14}$), and octadecaborane ($B_{18}H_{22}$) or an icosadecaborane. Once again, it will be understood that the foregoing list of source gases is provided for illustrative purposes only, and shall not be considered to represent a complete list of the source gases that could be delivered to the second plasma chamber 116.

The second, or ion source, plasma chamber 116 defines an aperture 117 aligned with the extraction aperture 114 of the first plasma chamber 102, forming a passageway therebetween for permitting electrons extracted from the first plasma chamber 102 to flow into the second plasma chamber 116. Preferably, the ion source plasma chamber 116 is configured to have a positively biased electrode 119 for attracting electrons injected into the ion source plasma chamber 116 in a so-called non-reflex mode to create the desired collisions between electrons and gas molecules to create ionization plasma. Alternatively, the electrode 119 can be biased negatively to cause electrons to be repelled back into the ion source plasma chamber 116 in a so-called reflex mode.

An extraction aperture 120 is configured in the second plasma chamber 116 to extract ions for formation of an ion beam for implantation.

It is important to note that in one embodiment the second plasma chamber 116 is biased positively with respect to the first plasma chamber 102 utilizing an external bias power supply 115 (FIG. 2). Electrons are thus extracted from the electron source plasma chamber 102 and injected into the ion source plasma chamber 116 where collisions are induced in the second plasma chamber 116 between the electrons provided by the first plasma chamber 102 and the supply gas supplied to the second plasma chamber 116 via the second gas source supply line 118, to create a plasma.

It should be noted that the first plasma chamber 102 and the second plasma chamber 116 can have three open boundaries: a gas inlet (e.g., a first gas supply inlet 122 and a second gas supply inlet 124), an opening to a high vacuum area (e.g., pumping aperture 112 and extraction aperture 120) and a common boundary apertures 114 and 117 forming the common passageway between the first and second plasma chambers, 102 and 104, respectively. In one embodiment the area of the common boundary apertures 114 and 117 is kept small compared to the apertures 112 and 120 into the high vacuum region, i.e. first plasma chamber aperture 112 and second plasma chamber aperture 120 for reasons that will be discussed hereinbelow.

In one exemplary ion source configuration in accordance with the present invention, the ion source of the present invention comprises components of a standard IHC ion source of the type manufactured and sold by Axcelis Technologies, of Beverly, Mass., wherein the ion source plasma chamber includes a standard arc chamber, configured with a standard anode, extraction system and source feed tube. The internally heated cathode element of the standard IHC source is removed and replaced with a small electron source plasma chamber mounted in its place, which contains components similar to a standard IHC ion source of the type manufactured and sold by Axcelis Technologies, including an arc chamber, a standard internally heated cathode element and a source feed tube.

Both plasma chambers also share a magnetic field oriented along the extraction aperture, provided by a standard Axcelis source magnet, depicted by reference numeral 130. It is well known that the ionization process (and in this case the electron generating process) becomes more efficient by inducing a vertical magnetic field in the plasma generating chamber. As such, in one embodiment electromagnet members 130 are positioned outside of the first and second plasma chambers, 102 and 116 respectively, preferably along the axis of the shared boundary therebetween. These electromagnet elements 130 induce a magnetic field that traps the electrons to improve the efficiency of the ionization process.

In one embodiment the electron source chamber 102 is thermally isolated from the ion source plasma chamber 116 via an insulative member 126 positioned therebetween, with the only power coupled to the ion source plasma chamber 116 being a small amount of radiative power, typically on the order of 10 W, provided from the cathode 108 through the common boundary aperture formed by apertures 114, 117, and the discharge power associated with the electron current injected into the ion source plasma chamber 166, typically 10 W for a decaborane or octadecaborane discharge. The low amount of power coupled to the ion source plasma chamber 116 facilitates maintaining the wall temperatures in chamber 116 low enough to prevent dissociation of large molecule gases. The electron source chamber 102 also is electrically isolated from the ion source plasma chamber 116 by the insulative member 126.

In one embodiment, the ion source plasma chamber 116 is configured with an extraction aperture 120 having an area of approximately 300 mm² (5 mm×60 mm). The electron source chamber 102 is also configured with a pumping aperture 112 of total area of approximately 300 mm². The common boundary aperture formed by apertures 114 and 117 shared by the two plasma chambers in one embodiment has an area on the order of 30 mm² (4×7.5 mm). In this configuration, operating with an argon gas source coupled to the electron source plasma chamber 102 and a decaborane or octadecaborane gas source coupled to the ion source plasma chamber 116, extracted ion beam currents of approximately 5 mA are easily obtained through the extraction aperture 120. Under these conditions, argon discharge currents and voltages in the electron source chamber 102 on the order of typically 0.2 A @ 40v have yielded 0.1 A electron current injected into the ion source plasma chamber 116 (with a voltage setting of 100V on the bias power supply 115). In the same physical configuration, switching to phosphine as a gas source in the ion source plasma chamber 116, increasing the electron source plasma discharge parameters to 5 A @ 60V enables the electron current injected into the ion source plasma to increase to 3 A at a setting of 120V on the bias supply, with ion beam currents in excess of 50 mA extracted through the extraction aperture 120.

As previously noted, the choice of the areas of the electron source plasma chamber pumping aperture 112 and ion source plasma chamber extraction aperture 120, is preferably large compared to the common boundary aperture created by apertures 114 and 117, which results in relatively high gas purity in each chamber, 102 and 116. Referring to the above example, argon flows into the ion source plasma chamber 116 through the 30 mm² common extraction aperture 114 and out through the 300 mm2 extraction aperture 120. As a result, argon density in the ion source plasma chamber 116 is only 10% of that in the electron source plasma chamber 102. By the same reasoning, the density of the second gas, supplied to the ion source plasma chamber 116 via gas supply line 118, which can flow into the electron source plasma chamber 102, is only 10% of that in the ion source plasma chamber 116. In a typical application, argon density in the electron source plasma chamber 102 and second gas density in the ion source plasma chamber 116 are approximately equal such that each plasma chamber gas is about 90% pure.

As a result of the foregoing ion source hardware configurations, the inventor has recognized that the formation of molecular ion species such as decaborane ($B_{10}H_{14}$) or octadecaborane ($B_{18}H_{22}$) ions within a second plasma chamber 116 utilizing electrons from the first plasma chamber 102 can avoid the typical ion source contamination problems associated with a cathode, for example, while the power dissipation attributes of such hardware can enable low electron current ionization applications typically associated with molecular species ionization, as well as high electron current ionization applications typically associated with monomer species ionization.

Figure 3:
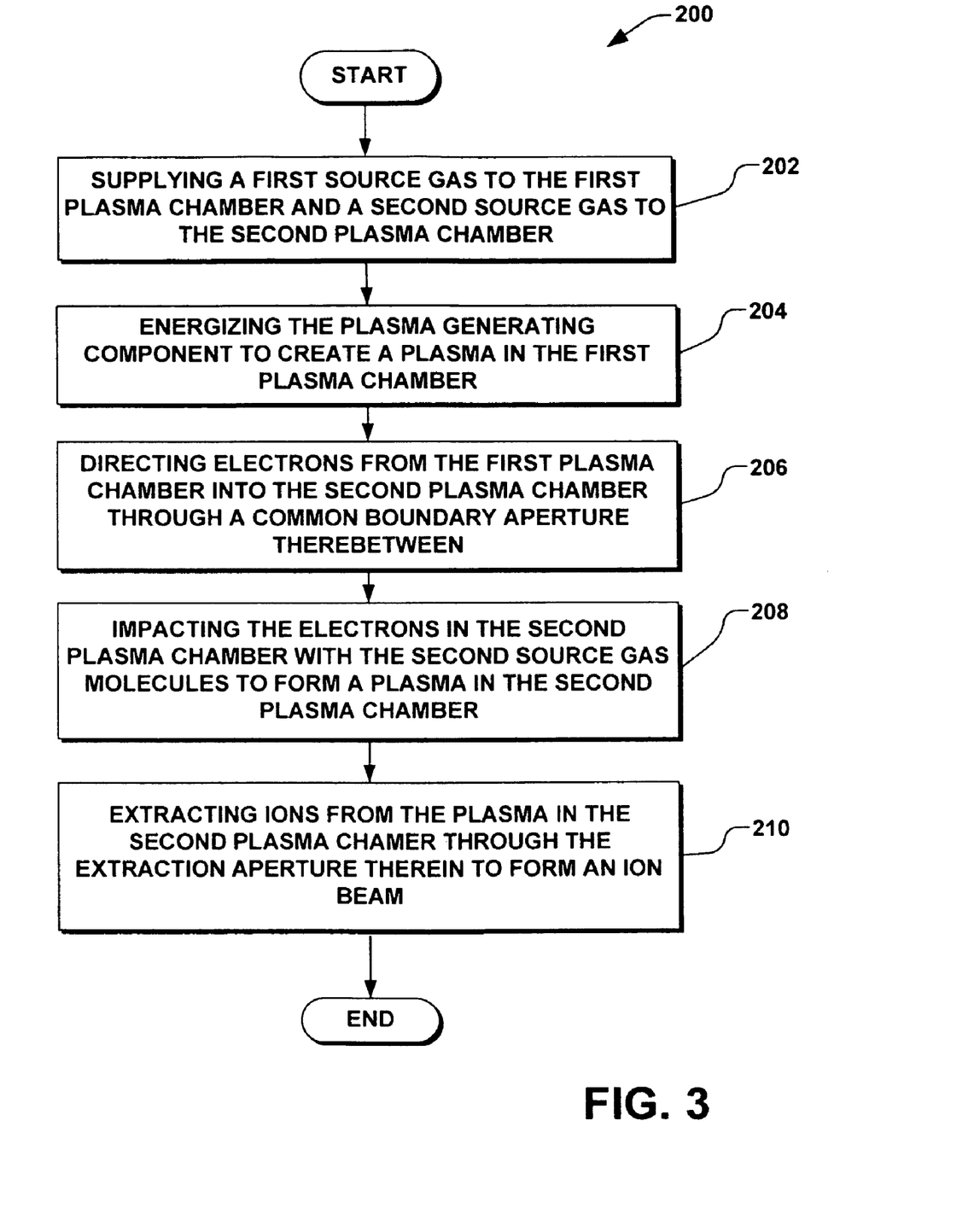
FIG. 3 is a flow chart of an exemplary method for creating and extracting ions from an ion source according to another exemplary aspect of the invention.

As illustrated in FIG. 3, the method 200 in accordance with the present invention begins at 202 by supplying a first gas through the gas supply line 106 to the first plasma chamber 102 that is in a vacuum condition (see FIG. 1) and a second gas through the second gas source supply line 118 to the second plasma chamber 116 that is also in a vacuum state (see FIG. 1). The ion source 100 (FIG. 1), for example, comprises the first plasma chamber 102 containing the first gas configured with a plasma generating component 104 (FIG. 1) for producing a plasma from the first gas.

At 204, a plasma generating component 104 (see FIG. 1) is energized to create a plasma in the first plasma chamber 102 (see FIG. 1) from interaction of the plasma generating component 104 and the first source gas (e.g., argon). For example, the plasma may be created by a DC discharge with a discharge current of 0.4 amps and a discharge voltage of 60 volts. At 206 electrons are extracted from the plasma created in the first plasma chamber 102 (see FIG. 1) and injected into the second plasma chamber 116 (see FIG. 1) through the common boundary area formed by apertures 114 and 117 formed in the first and second plasma chambers 102 and 116, respectively, allowing fluid communication therebetween (e.g., fluids comprising electrons, ions, and plasma). The second gas within the second plasma chamber 116, supplied via gas line 118, is impacted by the electrons extracted from the first plasma chamber 102 (see FIG. 1), thus forming a second plasma in the second plasma chamber 116 (see FIG. 1), at 208. Finally, ions are extracted from the plasma in the second plasma chamber 116 (see FIG. 1) through an extraction aperture 120 (FIG. 1) at 210.

Figure 4:
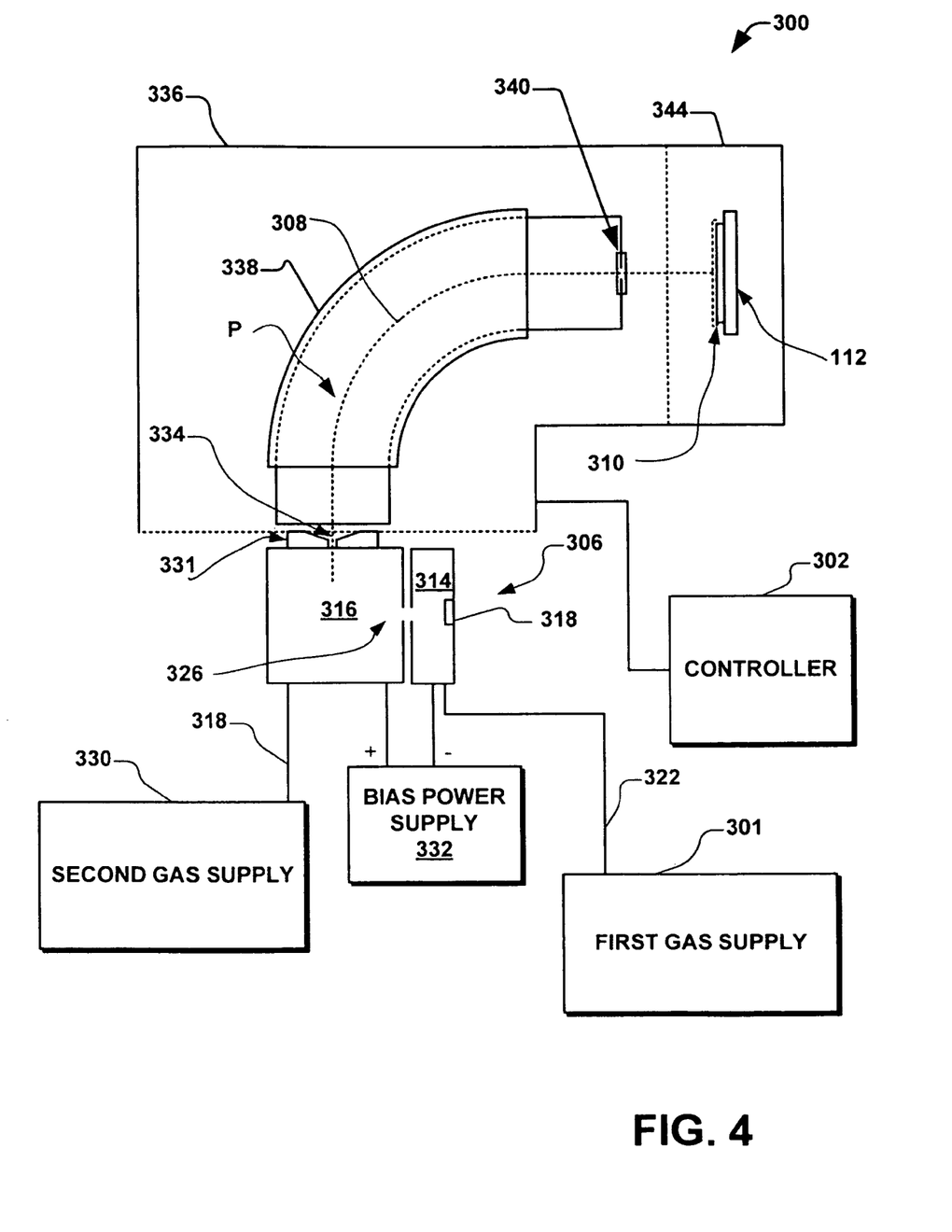
FIG. 4 is a schematic of an exemplary ion implantation system utilizing an exemplary ion source according to another aspect of the present invention.

Thus, the present invention describes a "double plasma ion source." It will be understood that this double plasma ion source described can be incorporated for use into an ion implantation system, as illustrated in the exemplary ion implantation system 300 of FIG. 4. The ion implantation apparatus 300 (also referred to as an ion implanter) is operably coupled to a controller 302 for controlling the various operations and processes implemented on the ion implantation apparatus 300. In accordance with the present invention, the ion implantation apparatus 300 includes the double plasma ion source assembly 306 described hereinabove for producing a quantity of ions for generating an ion beam 308 traveling along an ion beam path P, for implantation of the ions to a workpiece 310 (e.g., a semiconductor workpiece, display panel, etc.) held on a workpiece support platen 312. The ions can be formed from inert gases such as argon (Ar) and xenon (Xe), standard ion implantation gases such as boron trifluoride ($BF_3$), arsine ($AsH_3$) and phosphine ($PH_3$), reactive gases such as oxygen ($O_2$) and nitrogen trifluoride ($NF_3$), and large molecule gases such as decaborane ($B_{10}H_{14}$), and octadecaborane ($B_{18}H_{22}$).

The ion source assembly 306, comprises a first plasma chamber 314 (e.g., a plasma chamber or arc chamber) and a second plasma chamber 316, wherein the first plasma chamber 314 is configured with a plasma generating component 318, which can include a cathode 108 (see FIG. 2) and an anode 110 (see FIG. 2) for generating a plasma from a first gas introduced into the first plasma chamber 314 via a first gas feed line 322 from a first gas supply 301. The plasma generating component 318 can in the alternative comprise an RF induction coil, for example. The first gas can comprise at least one of the following: inert gases such as argon (Ar) and xenon (Xe), standard ion implantation gases such as boron trifluoride ($BF_3$), arsine ($AsH_3$) and phosphine ($PH_3$), and reactive gases such as oxygen ($O_2$) and nitrogen trifluoride ($NF_3$).

A second plasma chamber 316 is situated in fluid communication with the first plasma chamber 314 via a common boundary aperture 326 formed between the first and second plasma chambers, 314 and 316, wherein the second plasma chamber 316 contains a second gas introduced by a second gas feed line 328 from a second gas supply 320. The second gas can comprise at least one of the following: inert gases such as argon (Ar) and xenon (Xe), standard ion implantation gases such as boron trifluoride ($BF_3$), arsine ($AsH_3$) and phosphine ($PH_3$), reactive gases such as oxygen ($O_2$) and nitrogen trifluoride ($NF_3$), and large molecule gases such as decaborane ($B_{10}H_{14}$), and octadecaborane ($B_{18}H_{22}$).

The second plasma chamber 316 is preferably biased positive with respect to the first plasma chamber 314 by a bias power supply 332, enabling the extraction of electrons from the first plasma chamber 314 for injection into the second plasma chamber 316. When the extracted electrons collide with the second gas in the second plasma chamber 316 they create a plasma in the second plasma chamber 316. An extraction aperture 334 is provided in the second plasma chamber 316 to extract ions from the plasma formed therein.

The ion implantation system 300 further comprises an extraction electrode assembly 331 associated with source assembly 306, wherein the extraction electrode assembly 331 is biased to attract charged ions from the source assembly 306 for extraction through the extraction aperture. A beamline assembly 336 is further provided downstream of the ion source assembly 306, wherein the beamline assembly 336 generally receives the charged ions from the source 306. The beam line assembly 336, for example, comprises a beam guide 342, a mass analyzer 338, and a resolving aperture 340, wherein the beam line assembly 336 is operable to transport the ions along the ion beam path P for implantation into workpiece 310.

The mass analyzer 338, for example, further comprises a field generating component, such as a magnet (not shown), wherein the mass analyzer 338 generally provides a magnetic field across the ion beam 308, thus deflecting ions from the ion beam 308 at varying trajectories according to a charge to mass ratio associated with the ions extracted from the source 306. For example, ions traveling through the magnetic field experience a force that directs individual ions of a desired charge to mass ratio along the beam path P and deflects ions of undesired charge to mass ratios away from the beam path P. Once through the mass analyzer 338, the ion beam 308 is directed though a resolving aperture 340, wherein the ion beam 308 may be accelerated, decelerated, focused or otherwise modified for implantation into the workpiece 310 positioned within an end station 344.

Although the invention has been described with respect to certain preferred embodiments, it is obvious that equivalent alterations and modifications can and will occur to others skilled in the art upon the reading and understanding of this specification and annexed drawings. In particular regard to various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given application.

What is claimed is:

1. An ion source, comprising:
    a first plasma chamber including a plasma generating component and a first gas inlet for receiving a first gas such that said plasma generating component and said first gas interact to generate a first plasma including electrons within said first plasma chamber, wherein said first plasma chamber further defines an aperture for extracting electrons from said first plasma; and
    a second plasma chamber including a second gas inlet for receiving a second gas, wherein said second plasma chamber further defines an aperture in fluid communication with the aperture of said first plasma chamber, for receiving electrons extracted therefrom, such that the electrons and the second gas interact to generate a second plasma within said second plasma chamber, said second plasma chamber further defining an extraction aperture for extracting ions from said second plasma chamber,
    wherein said first plasma chamber further defines a pumping aperture forming a passageway into a high vacuum region that is not the second plasma chamber, wherein the pumping aperture has an area dimension greater than an area dimension associated with the aperture of the first plasma chamber for extracting electrons from said first plasma chamber.

2. The ion source of claim 1, wherein the plasma generating component comprises a cathode and an anode.

3. The ion source of claim 1, wherein the plasma generating component comprises an RF antenna.

4. The ion source of claim 1, further comprising a biasing power supply for creating a relative voltage differential between said first and second plasma chambers to effect transport of the extracted electrons from the first plasma chamber to the second plasma chamber.

5. The ion source of claim 1, wherein the first gas comprises at least one of the following: an inert gas such as argon (Ar) or xenon (Xe), a standard implant gas such as boron trifluoride ($BF_3$), arsine ($AsH_3$) or phosphine ($PH_3$) or a reactive gas such as $NF_3$ or $O_2$.

6. The ion source of claim 1, wherein the second gas comprises at least one of the following: an inert gas such as argon (Ar) or xenon (Xe), a standard implant gas such as boron trifluoride ($BF_3$), arsine ($AsH_3$) or phosphine ($PH_3$), a reactive gas such as $NF_3$ or $O_2$, or a large molecule gas such as decaborane ($B_{10}H_{14}$) or octadecaborane ($B_{18}H_{22}$).

7. The ion source of claim 1, further comprising an extraction electrode assembly associated with the extraction aperture, wherein the extraction electrode assembly is operable to extract ions from the ion source to generally form an ion beam.

8. An ion implantation system including an ion source, comprising:
    a first plasma chamber including a plasma generating component and a first gas inlet for receiving a first gas such that said plasma generating component and said first gas interact to generate a first plasma within said first plasma chamber, wherein said first plasma chamber further defines an aperture for extracting electrons from said first plasma; and
    a second plasma chamber including a second gas inlet for receiving a second gas, wherein said second plasma chamber further defines an aperture in fluid communication with the aperture of said first plasma chamber, for receiving electrons extracted therefrom, such that the electrons and the second gas interact to generate a second plasma within said second plasma chamber, said second plasma chamber further defining an extraction aperture for extracting ions from said second plasma chamber, wherein said first plasma chamber further defines a pumping aperture forming a passageway into a high vacuum region that is not the second plasma chamber, wherein the pumping aperture has an area dimension greater than an area dimension associated with the aperture of the first plasma chamber for extracting electrons from said first plasma chamber.

9. The ion source of claim 8, wherein the plasma generating component comprises a cathode heater and an anode.

10. The ion source of claim 8, wherein the plasma generating component comprises an RF antenna.

11. The ion source of claim 8, further comprising a biasing power supply for creating a relative voltage differential between said first and second plasma chambers to effect transport of the extracted electrons from the first plasma chamber to the second plasma chamber.

12. The ion source of claim 8, further comprising an extraction apparatus associated with the extraction aperture, wherein the extraction apparatus is operable to extract ions from the ion source to generally form an ion beam.

13. An ion implantation system, comprising:
a double plasma ion source to produce an ion beam;
a beamline assembly comprising a mass analyzer for receiving said ion beam from said ion source and providing a mass analyzed ion beam comprising ions of a desired mass-energy ratio; and
an end station configured for implanting a workpiece with said ion beam,
wherein the double plasma ion source further comprises:
a first plasma chamber including a plasma generating component and a first gas inlet for receiving a first gas such that said plasma generating component and said first gas interact to generate a first plasma including electrons within said first plasma chamber, wherein said first plasma chamber further defines an aperture for extracting electrons from said first plasma; and
a second plasma chamber including a second gas inlet for receiving a second gas, wherein said second plasma chamber further defines an aperture in fluid communication with the aperture of said first plasma chamber, for receiving electrons extracted therefrom, such that the electrons and the second gas interact to generate a second plasma within said second plasma chamber, said second plasma chamber further defining an extraction aperture for extracting ions from said second plasma chamber
wherein said first plasma chamber further defines a pumping aperture forming a passageway into a high vacuum region that is not the second plasma chamber, wherein the pumping aperture has an area dimension greater than an area dimension associated with the aperture of the first plasma chamber for extracting electrons from said first plasma chamber.

14. The ion implantation system of claim 13, wherein the ion source further comprises an extraction apparatus associated with the extraction aperture, wherein the extraction apparatus is operable to extract ions from the ion source to generally form said ion beam.

15. The ion implantation system of claim 13, wherein the ion source further comprises a biasing power supply for creating a relative voltage differential between said first and second plasma chambers and to effect transport of the extracted electrons from the first plasma chamber to the second plasma chamber.

16. The ion implantation system of claim 13, wherein the plasma generating component further comprises a cathode, an anode, or an RF antenna.

* * * * *